(12) United States Patent
Choi et al.

(10) Patent No.: US 7,964,881 B2
(45) Date of Patent: Jun. 21, 2011

(54) SEMICONDUCTOR LIGHT EMITTING DEVICE, METHOD OF MANUFACTURING THE SAME, AND SEMICONDUCTOR LIGHT EMITTING DEVICE PACKAGE USING THE SAME

(75) Inventors: Pun Jae Choi, Gyunggi-do (KR); Jin Hyun Lee, Gyunggi-do (KR); Ki Yeol Park, Daegu (KR); Myong Soo Cho, Gyunggi-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 145 days.

(21) Appl. No.: 12/189,428

(22) Filed: Aug. 11, 2008

(65) Prior Publication Data
US 2009/0101923 A1  Apr. 23, 2009

(30) Foreign Application Priority Data
Oct. 19, 2007  (KR) ................ 10-2007-0105365

(51) Int. Cl.
*H01L 33/00* (2010.01)

(52) U.S. Cl. .............. 257/89; 257/79; 257/E33.034; 257/E33.062; 438/26

(58) Field of Classification Search ............ 257/76, 257/89, 79; 438/26
See application file for complete search history.

(56) References Cited

U.S. PATENT DOCUMENTS

| | | | |
|---|---|---|---|
| 6,201,265 B1 * | 3/2001 | Teraguchi | 257/99 |
| 6,255,129 B1 * | 7/2001 | Lin | 438/26 |
| 6,459,100 B1 | 10/2002 | Doverspike et al. | |
| 6,828,596 B2 | 12/2004 | Steigerwald et al. | |
| 2007/0114564 A1 * | 5/2007 | Lee et al. | 257/103 |
| 2007/0181895 A1 * | 8/2007 | Nagai | 257/98 |
| 2008/0179605 A1 * | 7/2008 | Takase et al. | 257/94 |
| 2008/0191215 A1 * | 8/2008 | Choi et al. | 257/76 |
| 2008/0237622 A1 * | 10/2008 | Choi et al. | 257/98 |
| 2008/0277674 A1 * | 11/2008 | Nagai et al. | 257/88 |

(Continued)

FOREIGN PATENT DOCUMENTS

DE 100 26 255 A1  11/2001

(Continued)

OTHER PUBLICATIONS

German Office Action, w/ English translation thereof, issued in German Patent Application No. 10 2009 010 480.1 dated Oct. 14, 2009.

(Continued)

*Primary Examiner* — A. Sefer
(74) *Attorney, Agent, or Firm* — McDermott Will & Emery LLP

(57) ABSTRACT

There is provided a semiconductor light emitting device, a method of manufacturing the same, and a semiconductor light emitting device package using the same. A semiconductor light emitting device having a first conductivity type semiconductor layer, an active layer, a second conductivity type semiconductor layer, a second electrode layer, and insulating layer, a first electrode layer, and a conductive substrate sequentially laminated, wherein the second electrode layer has an exposed area at the interface between the second electrode layer and the second conductivity type semiconductor layer, and the first electrode layer comprises at least one contact hole electrically connected to the first conductivity type semiconductor layer, electrically insulated from the second conductivity type semiconductor layer and the active layer, and extending from one surface of the first electrode layer to at least part of the first conductivity type semiconductor layer.

12 Claims, 12 Drawing Sheets

U.S. PATENT DOCUMENTS

2008/0303055 A1* 12/2008 Seong .......................... 257/103
2009/0101923 A1    4/2009 Choi et al.
2009/0173952 A1*  7/2009 Takeuchi et al. ............... 257/79

FOREIGN PATENT DOCUMENTS

| DE | 10 2007 022 947 A1 | 10/2008 |
| JP | 2003-347653 | 12/2003 |
| JP | 2005-322722 | * 11/2005 |
| KR | 10-2006-0010527 | 2/2006 |
| WO | WO 2007/074969 | * 7/2007 |

OTHER PUBLICATIONS

Korean Office Action, with English translation, issued in Korean Patent Application No. 10-2007-0105365, dated Jan. 29, 2009.

United States Office Action issued in U.S. Appl. No. 12/757,557 dated May 27, 2010.

United States Office Action issued in U.S. Appl. No. 12/757,557, mailed Jan. 5, 2011.

* cited by examiner

SEMICONDUCTOR LIGHT EMITTING DEVICE, METHOD OF MANUFACTURING THE SAME, AND SEMICONDUCTOR LIGHT EMITTING DEVICE PACKAGE USING THE SAME

CROSS-REFERENCE TO RELATED APPLICATIONS

This application claims the priority of Korean Patent Application No. 10-2007-0105365 filed on Oct. 19, 2007, in the Korean Intellectual Property Office, the disclosure of which is incorporated herein by reference.

BACKGROUND OF THE INVENTION

1. Field of the Invention

The present invention relates to a semiconductor light emitting device, a method of manufacturing the same, and a semiconductor light emitting device package using the same, and more particularly, to a semiconductor light emitting device that ensures a maximum light emitting area to maximize luminous efficiency and perform uniform current spreading by using an electrode having a small area, and enables mass production at low cost with high reliability and high quality, a method of manufacturing the same, and a semiconductor light emitting device package using the same.

2. Description of the Related Art

Semiconductor light emitting devices include materials that emit light. For example, light emitting diodes (LEDs) are devices that use diodes, to which semiconductors are bonded, convert energy generated by combination of electrons and holes into light, and emit light. The semiconductor light emitting devices are being widely used as lighting, display devices, and light sources, and development of semiconductor light emitting devices has been expedited.

In particular, the widespread use of cellular phone keypads, side viewers, and camera flashes, which use GaN-based light emitting diodes that have been actively developed and widely used in recent years, contribute to the active development of general illumination that uses light emitting diodes. Applications of the light emitting diodes, such as backlight units of large TVs, headlights of cars, and general illumination, have advanced from small portable products to large products having high power, high efficiency, and high reliability. Therefore, there has been a need for light sources that have characteristics required for the corresponding products.

In general, a semiconductor junction light emitting device has a structure in which p-type and n-type semiconductors are bonded to each other. In the semiconductor junction structure, light may be emitted by recombination of electrons and holes at a region where the two types of semiconductors are bonded to each other. In order to activate the light emission, an active layer may be formed between the two semiconductors. The semiconductor junction light emitting device includes a horizontal structure and a vertical structure according to the position of electrodes of semiconductor layers. The vertical structure includes an epi-up structure and a flip-chip structure. As described above, structural characteristics of semiconductor light emitting devices that are required according to characteristics of individual products are seriously taken into account.

FIGS. 1A and 1B are views illustrating a horizontal light emitting device according to the related art. FIG. 1C is a cross-sectional view illustrating a vertical light emitting device according to the related art. Hereinafter, for the convenience of explanation, in FIGS. 1A to 1C, a description will be made on the assumption that an n-type semiconductor layer is in contact with a substrate, and a p-type semiconductor layer is formed on an active layer.

Referring to FIG. 1A, a horizontal light emitting device having an epi-up structure will be described first. In FIG. 1A, a description will be made on the assumption that a semiconductor layer formed at the outermost edge is a p-type semiconductor layer. A semiconductor light emitting device 1 includes a non-conductive substrate 13, an n-type semiconductor layer 12, an active layer 11, and a p-type semiconductor layer 10. An n-type electrode 15 and a p-type electrode 14 are formed on the n-type semiconductor layer 12 and the p-type semiconductor layer 10, respectively, and are connected to an external current source (not shown) to apply a voltage to the semiconductor light emitting device 1.

When a voltage is applied to the semiconductor light emitting device 1 through the electrodes 14 and 15, electrons move from the n-type semiconductor layer 12, and holes move from the p-type semiconductor layer 10. Light is emitted by recombination of the electrons and the holes. The semiconductor light emitting device 1 includes the active layer 11, and light is emitted from the active layer 11. In the active layer 11, the light emission of the semiconductor light emitting device 1 is activated, and light is emitted. In order to make an electrical connection, the n-type electrode and the p-type electrode are located on the n-type semiconductor layer 12 and the p-type semiconductor layer 10, respectively, with the lowest contact resistances.

The position of the electrodes may change according to the substrate type. For example, when the substrate 13 is a sapphire substrate that is a non-conductive substrate, the electrode of the n-type semiconductor layer 12 cannot be formed on the non-conductive substrate 13, but on the n-type semiconductor layer 12.

Therefore, referring to FIG. 1A, when the n-type electrode 15 is formed on the n-type semiconductor 12, parts of the p-type semiconductor layer 10 and the active layer 12 that are formed at the upper side are consumed to form an ohmic contact. The formation of the electrode results in a decrease of light emitting area of the semiconductor light emitting device 1, and thus luminous efficiency also decreases.

In FIG. 1B, a horizontal light emitting device has a structure that increases luminous efficiency is illustrated. The semiconductor light emitting device, shown in FIG. 1B, is a flip chip semiconductor light emitting device 2. A substrate 23 is located at the top. Electrodes 24 and 25 are in contact with electrode contacts 26 and 27, respectively, which are formed on a conductive substrate 28. Light emitted from an active layer 21 is emitted through the substrate 23 regardless of the electrodes 24 and 25. Therefore, the decrease in luminous efficiency that is caused in the semiconductor light emitting device, shown in FIG. 1A, can be prevented.

However, despite the high luminous efficiency of the flip chip light emitting device 2, the n-type electrode and the p-type electrode in the light emitting device 2 need to be disposed in the same plane and bonded in the semiconductor light emitting device 2. After being bonded, the n-type electrode and the p-type electrode are likely to be separated from the electrode contacts 26 and 27. Therefore, there is a need for expensive precision processing equipment. This causes an increase in manufacturing costs, a decrease in productivity, a decrease in yield, and a decrease in product reliability.

In order to solve a variety of problems including the above-described problems, a vertical light emitting device that uses a conductive substrate, not the non-conductive substrate, appeared. A light emitting device 3, shown in FIG. 1C, is a vertical light emitting device. When a conductive substrate 33 is used, an n-type electrode 35 may be formed on the substrate 33. The conductive substrate 33 may be formed of a conductive material, for example, Si. In general, it is difficult to form semiconductor layers on the conductive substrate due to lattice-mismatching. Therefore, semiconductor layers are grown by using a substrate that allows easy growth of the semiconductor layers, and then a conductive substrate is bonded after removing the substrate for growth.

When the non-conductive substrate is removed, the conductive substrate 33 is formed on the n-type semiconductor layer 32, such that the light emitting device 3 has a vertical structure. When the conductive substrate 33 is used, since a voltage can be applied to the n-type semiconductor layer 32 through the conductive substrate 33, an electrode can be formed on the substrate 33. Therefore, as shown in FIG. 1C, the n-type electrode 35 is formed on the conductive substrate 33, and the p-type electrode 34 is formed on the p-type semiconductor layer 30, such that the semiconductor light emitting device having the vertical structure can be manufactured.

However, when a high-power light emitting device having a large area is manufactured, an area ratio of the electrode to the substrate needs to be high for current spreading. Therefore, light extraction is limited, light loss is caused by optical absorption, luminous efficiency decreases, and product reliability is reduced.

SUMMARY OF THE INVENTION

An aspect of the present invention provides to a semiconductor light emitting device that ensures a maximum light emitting area to maximize luminous efficiency and perform uniform current spreading by using an electrode having a small area, and enables mass production at low cost with high reliability and high quality, a method of manufacturing the same, and a semiconductor light emitting device package using the same.

According to an aspect of the present invention, there is provided a semiconductor light emitting device having a first conductivity type semiconductor layer, an active layer, a second conductivity type semiconductor layer, a second electrode layer, and insulating layer, a first electrode layer, and a conductive substrate sequentially laminated, wherein the second electrode layer has an exposed area at the interface between the second electrode layer and the second conductivity type semiconductor layer, and the first electrode layer comprises at least one contact hole electrically connected to the first conductivity type semiconductor layer, electrically insulated from the second conductivity type semiconductor layer and the active layer, and extending from one surface of the first electrode layer to at least part of the first conductivity type semiconductor layer.

The semiconductor light emitting device may further include an electrode pad unit formed at the exposed area of the second electrode layer.

The exposed area of the second electrode layer may be a region exposed by a via hole formed through the first conductivity type semiconductor layer, the active layer, and the second conductivity type semiconductor layer.

The diameter of the via hole may increase in a direction from the second electrode layer toward the first conductivity type semiconductor layer.

An insulating layer may be formed on an inner surface of the via hole.

The exposed area of the second electrode layer may be formed at the edge of the semiconductor light emitting device.

The second electrode layer may reflect light generated from the active layer.

The second electrode layer may include one metal selected from a group consisting of Ag, Al, and Pt.

An irregular pattern may be formed on the surface of the first conductivity type semiconductor layer.

The irregular pattern may have a photonic crystal structure.

The conductive substrate may include one metal selected from a group consisting of Au, Ni, Cu, and W.

The conductive substrate may include one selected from a group consisting of Si, Ge, and GaAs.

According to another aspect of the present invention, there is provided a method of manufacturing a semiconductor light emitting device, the method including: sequentially laminating a first conductivity type semiconductor layer, an active layer, a second conductivity type semiconductor layer, a second electrode layer, an insulating layer, a first electrode layer, and a conductive substrate; forming an exposed area at the interface between the second electrode layer and the second conductivity type semiconductor layer; and forming at least one contact hole in the first electrode layer, the contact hole electrically connected to the first conductivity type semiconductor layer, electrically insulated from the second conductivity type semiconductor layer and the active layer, and extending from one surface of the first electrode layer to at least part of the first conductivity type semiconductor layer.

The forming an exposed area of the second electrode layer may include mesa etching the first conductivity type semiconductor layer, the active layer, and the second conductivity type semiconductor layer.

The conductive substrate may be formed by plating method and laminated. The conductive substrate may be laminated by a substrate bonding method.

According to still another aspect of the present invention, there is provided a semiconductor light emitting device package including: a semiconductor light emitting device package body having a recessed part formed at an upper surface thereof; a first lead frame and a second lead frame mounted to the semiconductor light emitting device package body, exposed at a lower surface of the recessed part, and separated from each other by a predetermined distance; a semiconductor light emitting device mounted to the first lead frame, wherein the semiconductor light emitting device has a first conductivity type semiconductor layer, an active layer, a second conductivity type semiconductor layer, a second electrode layer, an insulating layer, a first electrode layer, and a conductive substrate sequentially laminated, the second electrode layer comprises an exposed area at the interface between the second electrode layer and the second conductivity type semiconductor layer, and the first electrode layer comprises at least one contact hole electrically connected to the first conductivity type semiconductor layer, electrically insulated from the second conductivity type semiconductor layer and the active layer, and extending from one surface of the first electrode layer to at least part of the first conductivity type semiconductor layer.

The semiconductor light emitting device may further include an electrode pad unit formed at the exposed area of the second electrode layer, and the electrode pad unit is electrically connected to the second lead frame.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art.

Figure 1A:
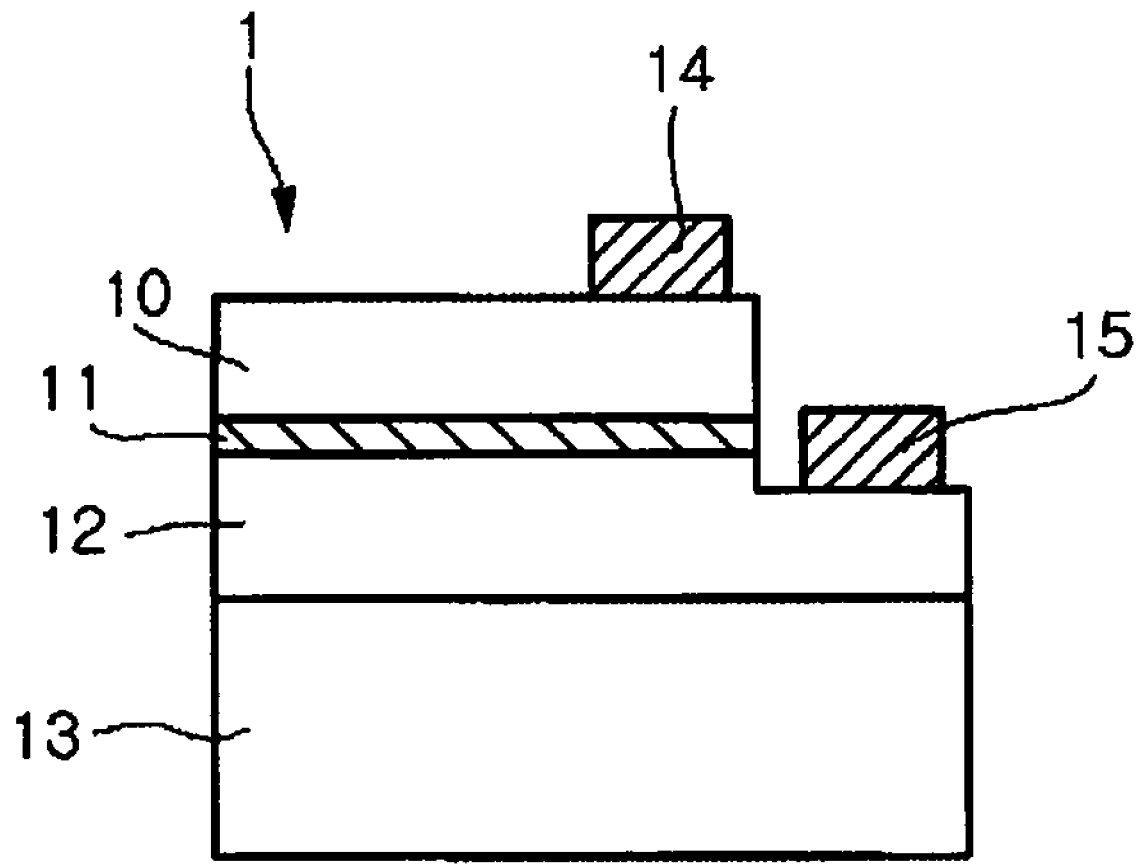
FIG. 1A is a cross-sectional view illustrating a horizontal light emitting device.
Figure 1B:
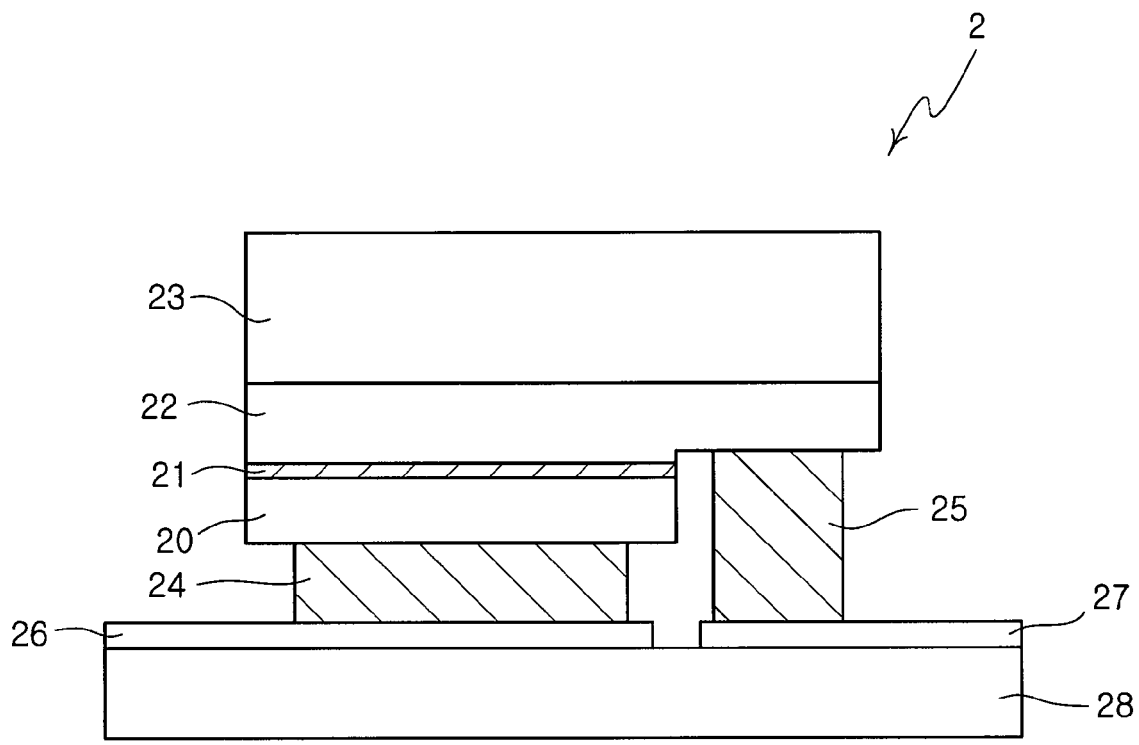
FIG. 1B is a cross-sectional view illustrating the horizontal light emitting device.
Figure 1C:
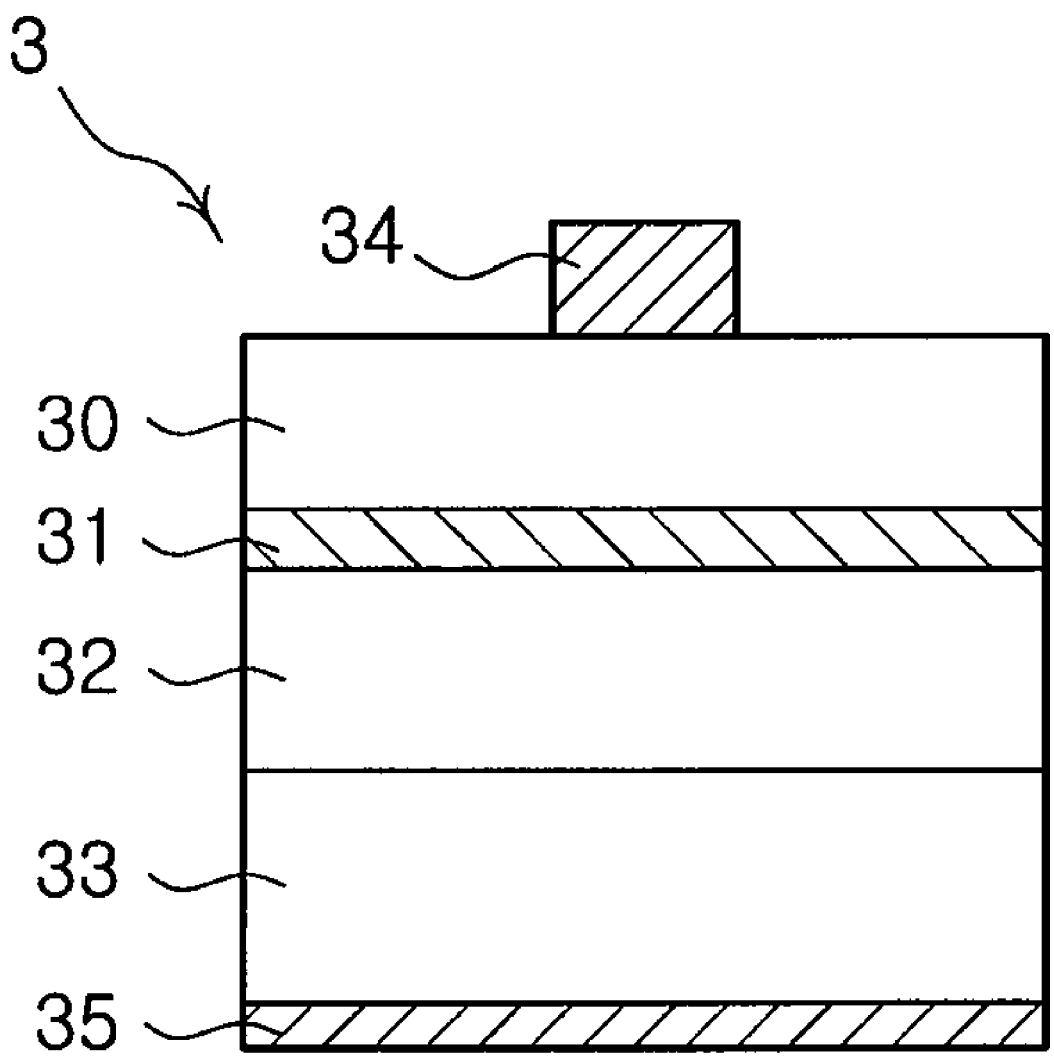
FIG. 1C is a cross-sectional view illustrating a vertical light emitting device.
Figure 2:
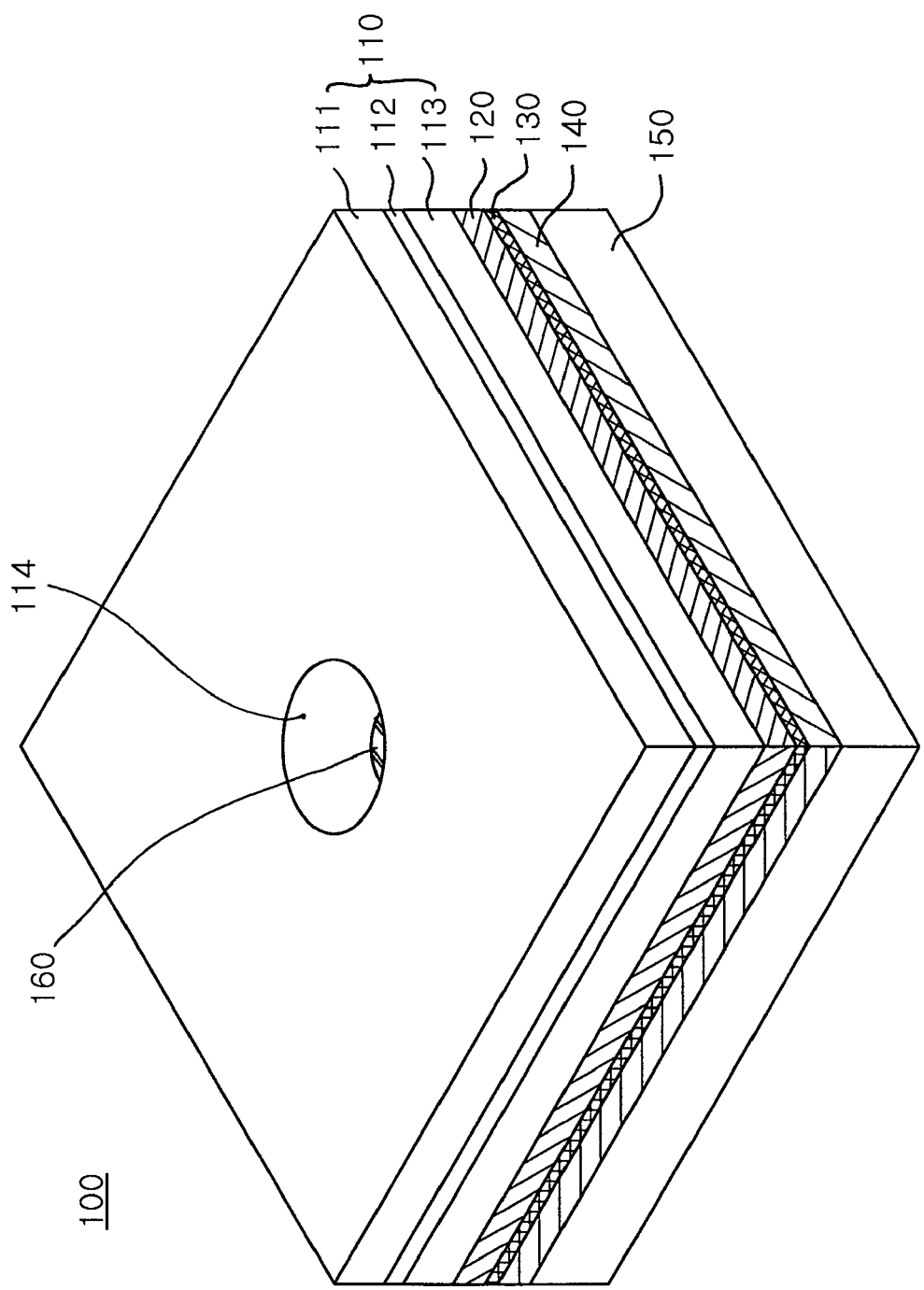
FIG. 2 is a perspective view illustrating a semiconductor light emitting device according to an exemplary embodiment of the present invention.
Figure 3:
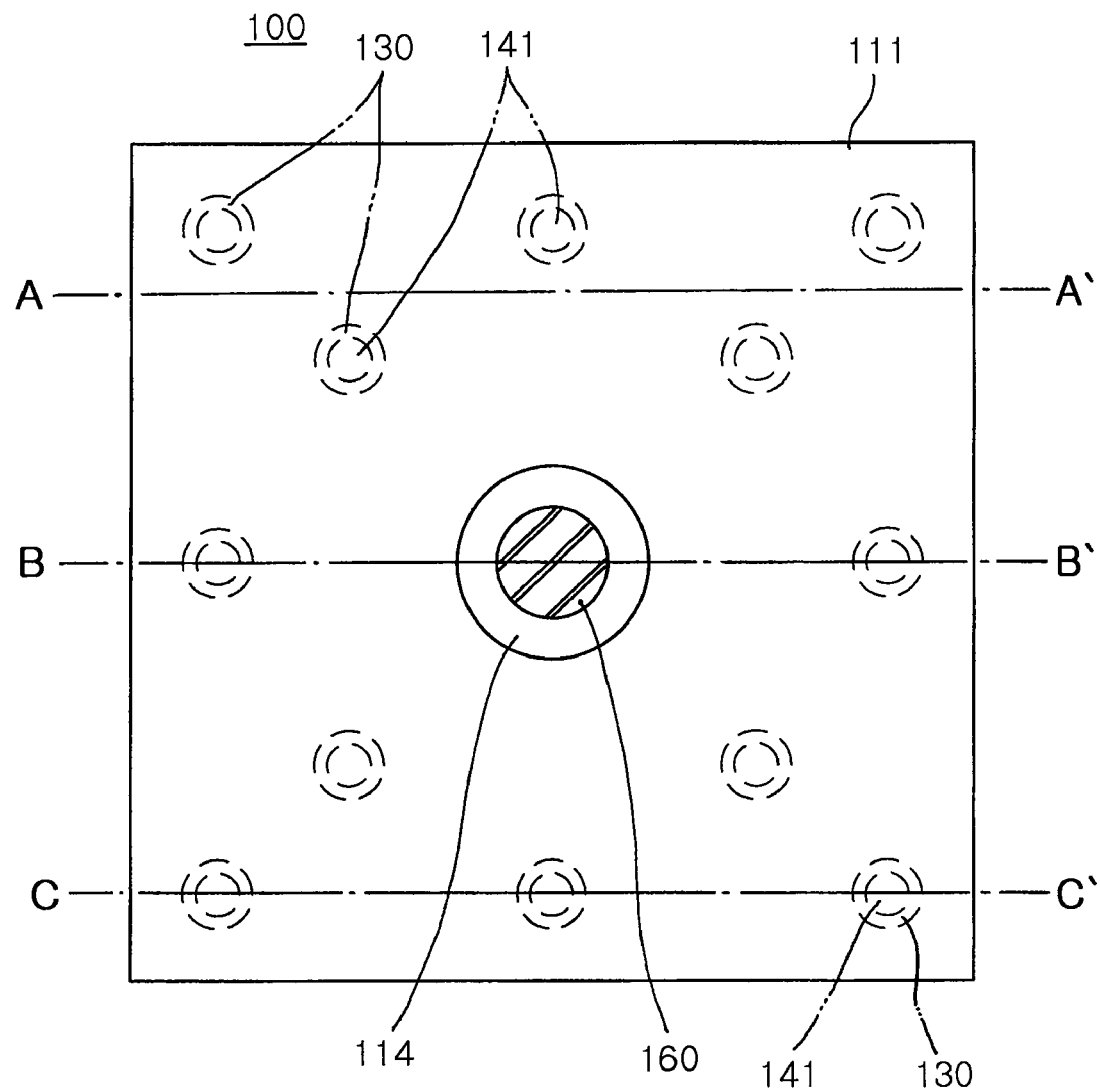
FIG. 3 is a plan view illustrating the semiconductor light emitting device shown in FIG. 2.

FIG. 2 is a perspective view illustrating a semiconductor light emitting device according to an exemplary embodiment of the invention. FIG. 3 is a plan view illustrating the semiconductor light emitting device shown in FIG. 2. Hereinafter, a description will be made with reference to FIGS. 2 and 3.

A semiconductor light emitting device 100 according to the exemplary embodiment of the invention includes a first conductivity type semiconductor layer 111, an active layer 112, a second conductivity type semiconductor layer 113, a second electrode layer 120, a first insulating layer 130, a first electrode layer 140, and a conductive substrate 150 that are sequentially laminated. At this time, the second electrode layer 120 has an exposed area at the interface between the second electrode layer 120 and the second conductivity type semiconductor layer 113. The first electrode layer 140 includes at least one contact hole 141. The contact hole 141 is electrically connected to the first conductivity type semiconductor layer 111, electrically insulated from the second conductivity type semiconductor layer 113 and the active layer 112, and extends from one surface of the first electrode layer 140 to at least part of the first conductivity type semiconductor layer 111.

In the semiconductor light emitting device 100, the first conductivity type semiconductor layer 111, the active layer 112, and the second conductivity type semiconductor layer 113 perform light emission. Hereinafter, they are referred to as a light emitting lamination 110. That is, the semiconductor light emitting device 100 includes the light emitting lamination 110, the first electrode layer 140, and the first insulating layer 130. The first electrode layer 140 is electrically connected to the first conductivity type semiconductor layer 111. The second electrode layer 120 is electrically connected to the second conductivity type semiconductor layer 113. The first insulating layer 130 electrically insulates the electrode layers 120 and 140 from each other. Further, the conductive substrate 150 is included as a substrate to grow or support the semiconductor light emitting device 100.

Each of the semiconductor layers 111 and 113 may be formed of a semiconductor, such as a GaN-based semiconductor, a ZnO-based semiconductor, a GaAs-based semiconductor, a GaP-based semiconductor, and a GaAsP-based semiconductor. The semiconductor layer may be formed by using, for example, molecular beam epitaxy (MBE). In addition, each of the semiconductor layers may be formed of any one of semiconductors, such as a III-V semiconductor, a II-VI semiconductor, and Si. Each of the semiconductor layers 111 and 113 is formed by doping the above-described semiconductor with appropriate impurities in consideration of the conductivity type.

The active layer 112 is a layer where light emission is activated. The active layer 112 is formed of a material that has a smaller energy bandgap than each of the first conductivity type semiconductor layer 111 and the second conductivity type semiconductor layer 113. For example, when each of the first conductivity type semiconductor layer 111 and the second conductivity type semiconductor layer 113 is formed of a GaN-based compound, the active layer 112 may be formed by using an InAlGaN-based compound semiconductor that has a smaller energy bandgap than GaN. That is, the active layer 112 may include $In_xAl_yGa_{(1-x-y)}N$ ($0 \leq x \leq 1$, $0 \leq y \leq 1$, $0 \leq x+y \leq 1$).

In consideration of characteristics of the active layer 112, the active layer 120 is preferably not doped with impurities. A wavelength of light emitted can be controlled by adjusting a mole ratio of constituents. Therefore, the semiconductor light emitting device 100 can emit any one of infrared light, visible light, and UV light according to the characteristics of the active layer 112.

Each of the electrode layers 120 and 140 is formed in order to apply a voltage to the same conductivity type semiconductor layer. Therefore, in consideration of electroconductivity, the electrode layers 120 and 140 may be formed of metal. That is, the electrode layers 120 and 140 include electrodes that electrically connect the semiconductor layers 111 and 113 to an external current source (not shown). The electrode layers 120 and 140 may include, for example, Ti as an n-type electrode, and Pd or Au as a p-type electrode.

The first electrode layer 140 is connected to the first conductivity type semiconductor layer 111, and the second electrode layer 120 is connected to the second conductivity type semiconductor layer 113. That is, since the first and second layers 140 and 120 are connected to the different conductivity type semiconductor layers from each other, the first and second layers 140 and 120 are electrically separated from each other by the first insulating layer 130. Preferably, the first insulating layer 130 is formed of a material having low electroconductivity. The first insulating layer 130 may include, for example, an oxide such as $SiO_2$.

Preferably, the second electrode layer 120 reflects light generated from the active layer 112. Since the second electrode layer 120 is located below the active layer 112, the second electrode layer 120 is located at the other side of a direction in which the semiconductor light emitting device 100 emits light on the basis of the active layer 112. Light moving from the active layer 112 toward the second electrode layer 120 is in an opposition direction to the direction in which the semiconductor light emitting device 100 emits light. Therefore, the light proceeding toward the second electrode layer 120 needs to be reflected to increase luminous efficiency. Therefore, when the second electrode layer 120 has light reflectivity, the reflected light moves toward a light emitting surface to thereby increase the luminous efficiency of the semiconductor light emitting device 100.

In order to reflect the light generated from the active layer 112, preferably, the second electrode layer 120 is formed of metal that appears white in the visible ray region. For example, the white metal may be any one of Ag, Al, and Pt.

The second electrode layer 120 includes an exposed area at the interface between the second electrode layer 120 and the second conductivity type semiconductor layer 113. A lower surface of the first electrode layer 140 is in contact with the conductive substrate 150, and the first electrode layer 140 is electrically connected to the external current source (not shown) through the conductive substrate 150. However, the second electrode layer 120 requires a separate connecting region so as to be connected to the external current source (not shown). Therefore, the second electrode layer 120 includes an area that is exposed by partially etching the light emitting lamination 110.

In FIG. 2, an example of a via hole 114 is shown. The via hole 114 is formed by etching the center of the light emitting lamination 110 to form an exposed area of the second electrode layer 120. An electrode pad unit 160 may be further formed at the exposed area of the second electrode layer 120. The second electrode layer 120 can be electrically connected to the external power source (not shown) by the exposed region thereof. At this time, the second electrode layer 120 is electrically connected to the external power source (not shown) by using the electrode pad unit 160. The second electrode layer 120 can be electrically connected to the external current source (not shown) by a wire or the like. For convenient connection to the external current source, preferably, the diameter of the via hole increases from the second electrode layer toward the first conductivity type semiconductor layer.

The via hole 114 is formed by selective etching. In general, the light emitting lamination 110 including the semiconductors is only etched, and the second electrode layer 120 including the metal is not etched. The diameter of the via hole 114 can be appropriately determined by those skilled in the art in consideration of the light emitting area, electrical connection efficiency, and current spreading in the second electrode layer 120.

The first electrode layer 140 includes at least one contact hole 141. The contact hole 141 is electrically connected to the first conductivity type semiconductor layer 111, electrically insulated from the second conductivity type semiconductor layer 113 and the active layer 112, and extends to at least part of the first conductivity type semiconductor layer 111. The first electrode layer 140 includes at least one contact hole 141 in order to connect the first conductivity type semiconductor layer 111 to the external current source (not shown). The contact hole 141 is formed through the second electrode layer 120 between the first electrode layer 140 and the second conductivity type semiconductor layer 113, the second conductivity type semiconductor layer 113, and the active layer 112, and extends to the first conductivity type semiconductor layer 111. Further, the contact hole 141 is formed of an electrode material.

When the contact hole 141 is only used for the electrical connection, the first electrode layer 140 may include one contact hole 141. However, in order to uniformly spread a current that is transmitted to the first conductivity type semiconductor layer 111, the first electrode layer 140 may include a plurality of contact holes 141 at predetermined positions.

The conductive substrate 150 is formed in contact with and is electrically connected to the first electrode layer 140. The conductive substrate 150 may be a metallic substrate or a semiconductor substrate. When the conductive substrate 150 is formed of metal, the metal may be any one of Au, Ni, Cu, and W. Further, when the conductive substrate 150 is the semiconductor substrate, the semiconductor substrate may be formed of any one of Si, Ge, and GaAs. The conductive substrate 150 may be a growth substrate. Alternatively, the conductive substrate 150 may be a supporting substrate. After a non-conductive substrate, such as a sapphire substrate having small lattice-mismatching, is used as a growth substrate, and the non-conductive substrate is removed, the supporting substrate is bonded.

When the conductive substrate 150 is the supporting substrate, it may be formed by using a plating method or a substrate bonding method. Specifically, examples of a method of forming the conductive substrate 150 in the semiconductor light emitting device 100 may include a plating method of forming a plating seed layer to form a substrate and a substrate bonding method of separately preparing the conductive substrate 150 and bonding the conductive substrate 150 by using a conductive adhesive, such as Au, Au—Sn, and Pb—Sr.

FIG. 3 is a plan view illustrating the semiconductor light emitting device 100. The via hole 114 is formed in an upper surface of the semiconductor light emitting device 100, and the electrode pad unit 160 is positioned at the exposed region of the second electrode layer 120. In addition, though not shown in the upper surface of the semiconductor light emitting device 100, in order to display the positions of the contact holes 141, the contact holes 141 are shown as a dotted line to display the positions of the contact holes 141. The first insulating layer 130 may extend and surround the contact hole 141 so that the contact hole 141 is electrically separated from the second electrode layer 120, the second conductivity type semiconductor layer 113, and the active layer 112. This will be described in more detail with reference to FIGS. 4B and 4C.

Figure 4A:
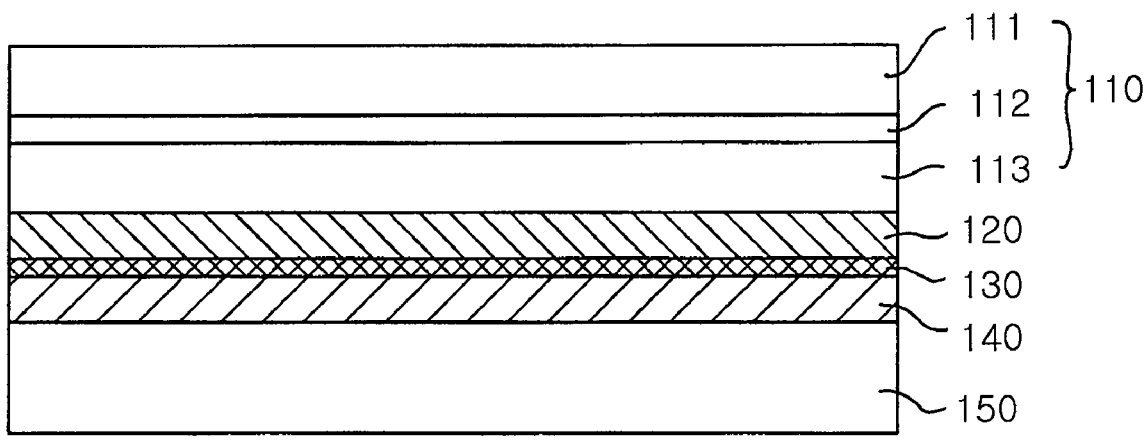
FIG. 4A is a cross-sectional view illustrating the semiconductor light emitting device, shown in FIG. 3, taken along the line A-A'.
Figure 4B:
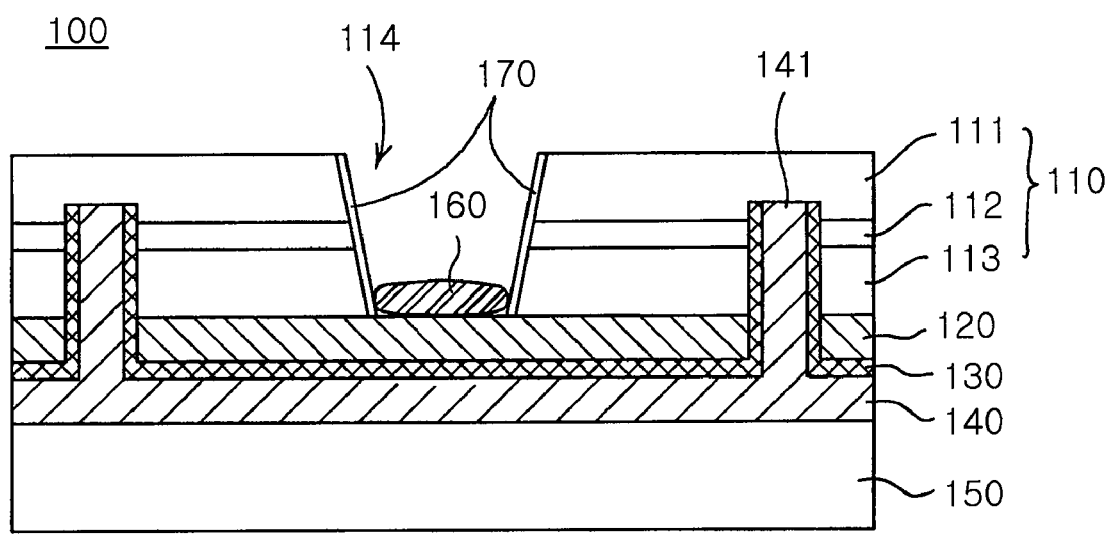
FIG. 4B is a cross-sectional view illustrating the semiconductor light emitting device, shown in FIG. 3, taken along the line B-B'.
Figure 4C:
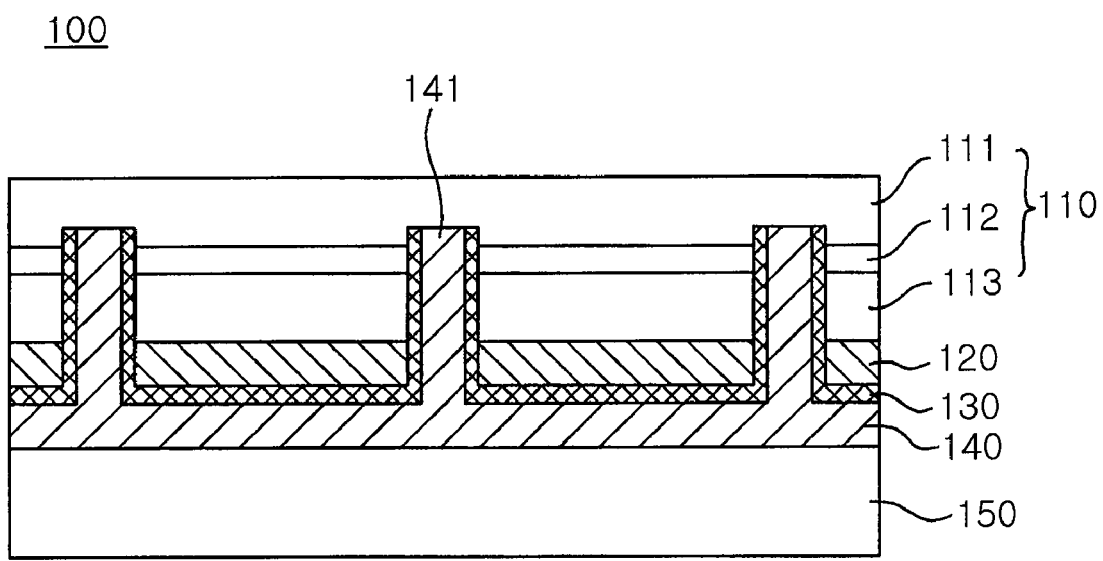
FIG. 4C is a cross-sectional view illustrating the semiconductor light emitting device, shown in FIG. 3, taken along the line C-C'.

FIG. 4A is a cross-sectional view illustrating the semiconductor light emitting device, shown in FIG. 3, taken along the line A-A'. FIG. 4B is a cross-sectional view illustrating the semiconductor light emitting device, shown in FIG. 3, taken along the line B-B'. FIG. 4C is a cross-sectional view illustrating the semiconductor light emitting device, shown in FIG. 3, taken along the line C-C'. The line A-A' is taken to show a cross section of the semiconductor light emitting device 100. The line B-B' is taken to show a cross section that includes the contact holes 141 and the via hole 114. The line C-C' is taken to show a cross section that only includes the contact holes 141. Hereinafter, the description will be described with reference to FIGS. 4A to 4C.

With reference to FIG. 4A, neither the contact hole 141 nor the via hole 114 is shown. Since the contact hole 141 is not connected by using a separate connecting line but electrically connected by the first electrode layer 140, the contact hole 141 is not shown in the cross section in FIG. 3.

Referring to FIGS. 4B and 4C, the contact hole 141 extends from the interface between the first electrode layer 140 and the second electrode layer 120 to the inside of the first conductivity type semiconductor layer 111. The contact hole 141 passes through the second conductivity type semiconductor layer 113 and the active layer 112 and extends to the first conductivity type semiconductor layer 111. The contact hole 141 extends at least to the interface between the active layer 112 and the first conductivity type semiconductor layer 111. Preferably, the contact hole 141 extends to part of the first conductivity type semiconductor layer 111. However, the contact hole 141 is used for the electrical connection and current spreading. Once the contact hole 141 is in contact with the first conductivity type semiconductor layer 111, the contact hole 141 does not need to extend to the outer surface of the first conductivity type semiconductor layer 111.

The contact hole 141 is formed to spread the current in the first conductivity type semiconductor layer 111. Therefore, a predetermined number of contact holes 141 are formed, and each of the contact holes 141 has an area small enough to allow uniform current spreading in the first conductivity type semiconductor layer 111. A small number of contact holes 141 may cause deterioration in electrical characteristics due to difficulties in performing current spreading. A large number of contact holes 141 may cause difficulties in forming the contact holes 141 and a reduction in light emitting area due to a decrease in area of the active layer. Therefore, each of the contact holes 141 is formed to have as small area as possible and allow uniform current spreading.

The contact hole 141 extends from the second electrode layer 120 to the inside of the first conductivity type semiconductor layer 111. Since the contact hole 141 is formed to spread the current in the first conductivity type semiconductor layer, the contact hole 141 needs to be electrically separated from the second conductivity type semiconductor layer 113 and the active layer 112. Therefore, preferably, the contact hole 141 is electrically separated from the second electrode layer 120, the second conductivity type semiconductor layer 113, and the active layer 112. Therefore, the first insulating layer 130 may extend while surrounding the contact hole 141. The electrical separation may be performed by using an insulating material, such as a dielectric.

In FIG. 4B, the exposed region of the second electrode layer 120 is formed so that the second electrode layer 120 is electrically connected to the external current source (not shown). The electrode pad unit 160 may be positioned at the exposed region. At this time, a second insulating layer 170 may be formed on an inner surface of the via hole 114 so that the light emitting lamination 110 and the electrode pad unit 160 can be electrically separated from each other.

As shown in FIG. 4A, since the first electrode layer 140 and the second electrode layer 120 are formed in the same plane, the semiconductor light emitting device 100 has characteristics of the horizontal semiconductor light emitting device 100. As shown in FIG. 4B, since the electrode pad unit 160 is formed at the surface of the second conductivity type semiconductor layer 120, the semiconductor light emitting device 100 can have characteristics of the vertical light emitting device. Therefore, the semiconductor light emitting device 100 has a structure into which the vertical structure and the horizontal structure are integrated.

In FIGS. 4A to 4C, the first conductivity type semiconductor layer 111 may be an n-type semiconductor layer, and the first electrode layer 140 may be an n-type electrode. In this case, the second conductivity type semiconductor layer 113 may be a p-type semiconductor layer, and the second electrode layer 120 may be a p-type electrode. Therefore, the first electrode layer 140 formed of the n-type electrode and the second electrode layer 120 formed of the p-type electrode may be electrically insulated from each other with the first insulating layer 130 interposed therebetween.

Figure 5:
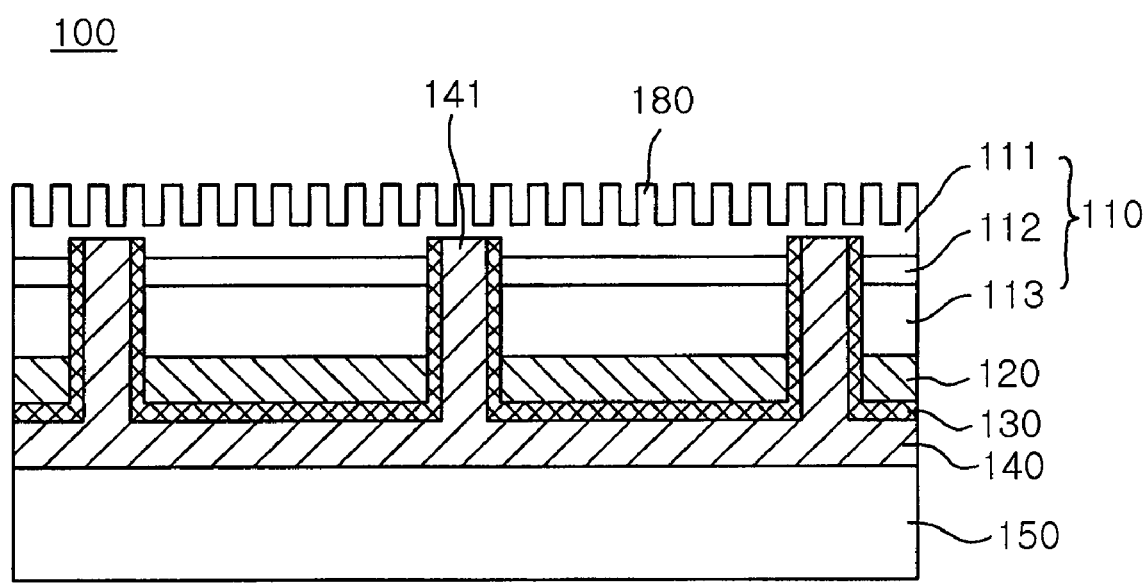
FIG. 5 is a view illustrating light emission in the semiconductor light emitting device having an irregular pattern at the surface thereof according to the embodiment of the present invention.

FIG. 5 is a view illustrating light emission in a semiconductor light emitting device having an irregular pattern formed at the surface thereof according to an exemplary embodiment of the present invention. The description of the same components that have already been described will be omitted.

In the semiconductor light emitting device 100 according to the exemplary embodiment of the invention, the first conductivity type semiconductor layer 111 forms the outermost edge in a direction in which emitted light moves. Therefore, an irregular pattern 180 can be easily formed on the surface by using a known method, such as photolithography. In this case, the light emitted from the active layer 112 passes through the irregular pattern 180 formed at the surface of the first conductivity type semiconductor layer 111, and then the light is extracted. The irregular pattern 180 results in an increase in light extraction efficiency.

The irregular pattern 180 may have a photonic crystal structure. Photonic crystals contain different media that have different refractive indexes and are regularly arranged like crystals. The photonic crystals can increase light extraction efficiency by controlling light in unit of length corresponding to a multiple of a wavelength of light.

Figure 6:
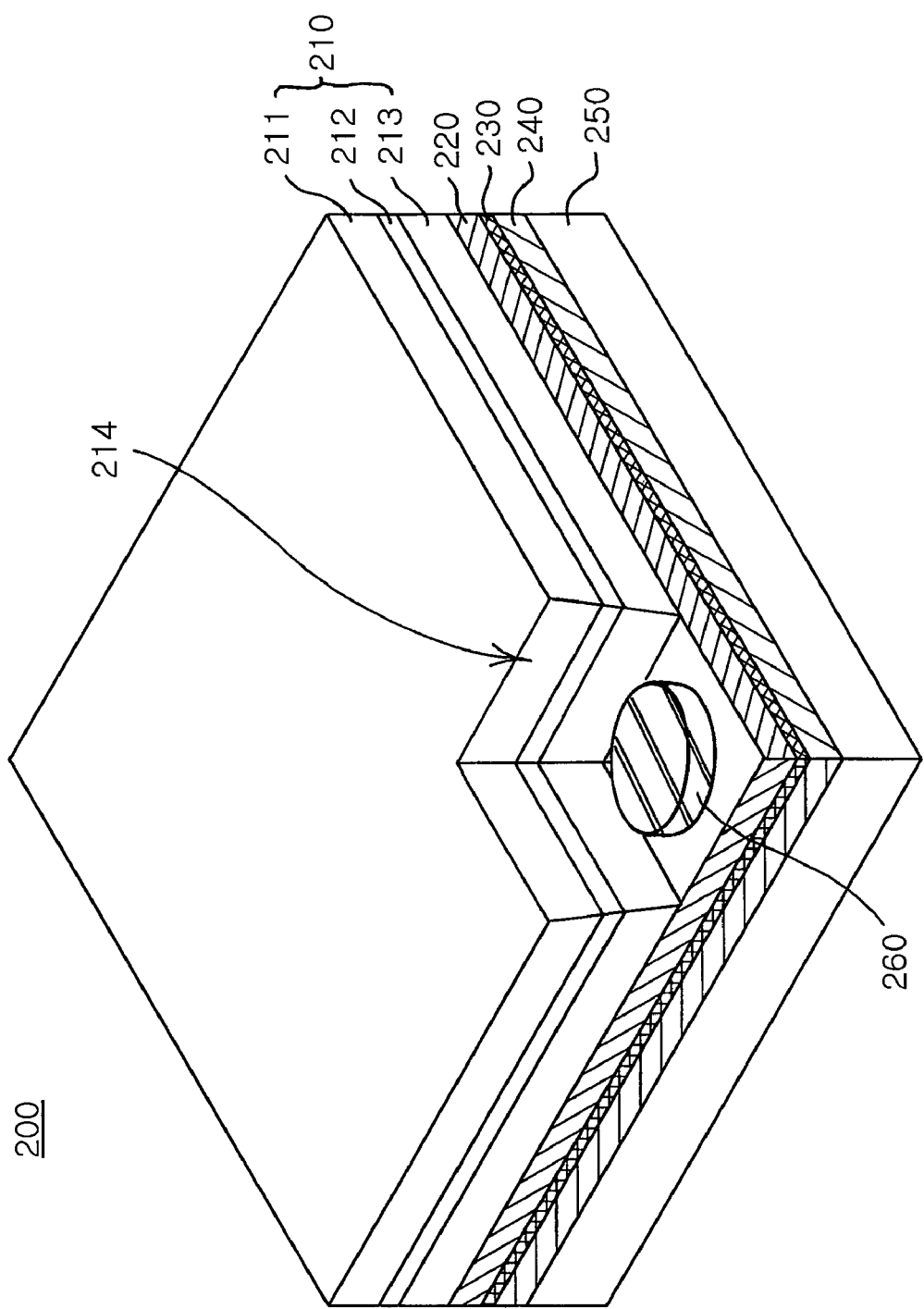
FIG. 6 is a view illustrating a second electrode layer exposed at the edge of the semiconductor light emitting device according to another embodiment of the present invention.

FIG. 6 is a view illustrating a second electrode layer exposed at the edge of a semiconductor light emitting device according to another exemplary embodiment of the present invention.

According to another exemplary embodiment of the present invention, a method of manufacturing a semiconductor light emitting device is provided. The method includes sequentially laminating a first conductivity type semiconductor layer 211, an active layer 212, a second conductivity type semiconductor layer 213, a second electrode layer 220, an insulating layer 230, a first electrode layer 240, and a conductive substrate 250; forming an exposed area at the interface between the second electrode layer 220 and the second conductivity type semiconductor layer 213; and forming at least one contact hole 241 in the second conductivity type semiconductor layer 213, the contact hole 241 electrically connected to the first conductivity type semiconductor layer 211, electrically insulated from the second conductivity type semiconductor layer 213 and the active layer 212, and extending from one surface of the first electrode layer 240 to at least part of the first conductivity type semiconductor layer 211.

At this time, the exposed area of the second electrode layer 220 may be formed by forming the via hole 214 in a light emitting lamination 210 (refer to FIG. 2). Alternatively, as shown in FIG. 6, the exposed area of the second electrode layer 220 may be formed by mesa etching the light emitting lamination 210. In this embodiment, the description of the same components as those of the embodiment that has been described with reference to 2 will be omitted.

Referring to FIG. 6, one edge of a semiconductor light emitting device 200 is mesa etched. The edge of the semiconductor light emitting device 200 is etched to expose the second electrode layer 220 at the interface between the second electrode layer 220 and the second conductivity type semiconductor layer 213. The exposed area of the second electrode layer 220 is formed at the edge of the semiconductor light emitting device 200. A process of forming the exposed region at the edge of the semiconductor light emitting device 200 is simpler than the process of forming the via hole in the above-described embodiment, and also allows a subsequent process of electrical connection to be easily performed.

Figure 7:
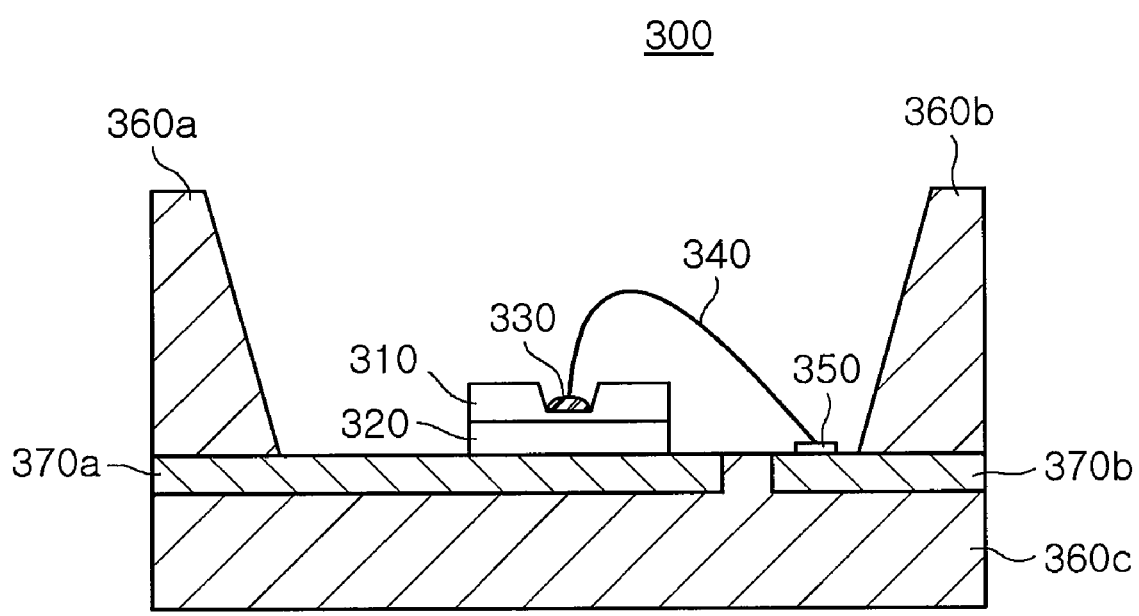
FIG. 7 is a cross-sectional view illustrating a semiconductor light emitting package according to still another embodiment of the present invention.

FIG. 7 is a cross-sectional view illustrating a semiconductor light emitting device package 300 according to still another embodiment of the present invention. The semiconductor light emitting device package 300 includes a semiconductor light emitting device package body 360a, 360b, and 360c having an upper surface in which a recessed part is formed, a first lead frame 370a and a second lead frame 370b mounted to the semiconductor light emitting device package body 360a, 360b, and 360c, exposed at a lower surface of the recessed part, and separated from each other by a predetermined distance, and a semiconductor light emitting device 310 and 320 mounted to the first lead frame 370a. The semiconductor light emitting device 310 and 320 is the semiconductor light emitting device having the via hole at the center thereof according to the exemplary embodiment of the invention that has been described with reference to FIG. 2. The description of the same components having been described will be omitted.

The semiconductor light emitting device 310 and 320 includes a light emitting unit 310 and a conductive substrate 320. The light emitting unit 310 includes first and second semiconductor layers, an active layer, and electrode layers. A via hole is formed in the light emitting unit 310, and the semiconductor light emitting device 310 and 320 further includes an electrode pad unit 330 at an exposed region. The conductive substrate 320 is electrically connected to the first lead frame 370a, and the electrode pad unit 330 is electrically connected to the second lead frame 370b by a wire 340 or the like.

The semiconductor light emitting device 310 and 320 is electrically connected to the second lead frame 370b, to which the semiconductor light emitting device 310 and 320 is not mounted, by wire bonding 340. Therefore, the semiconductor light emitting device can obtain high luminous efficiency and has a vertical structure. As shown in FIG. 7, the semiconductor light emitting device is mounted to the lead frame 370a by die bonding and to the lead frame 370b by wire bonding. Therefore, the process can be performed at relatively low costs.

Figure 8:
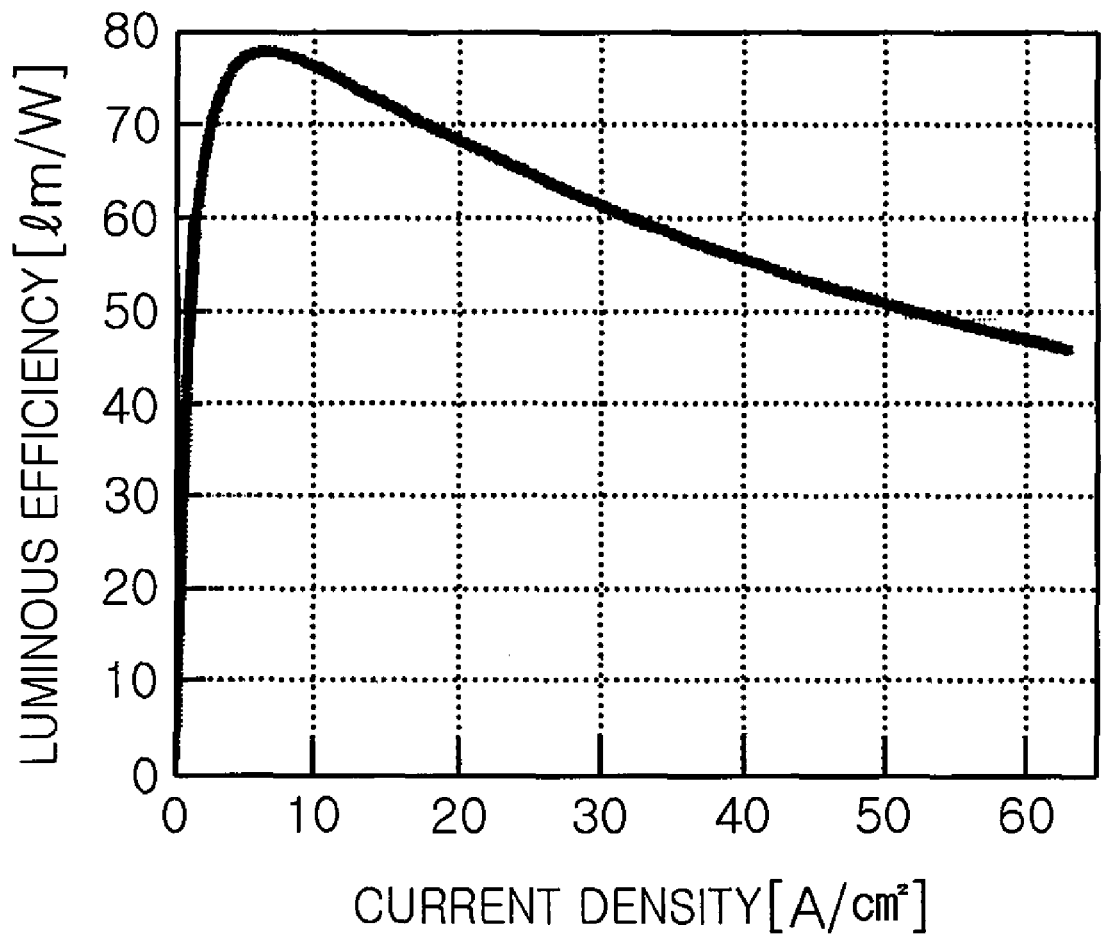
FIG. 8 is a graph illustrating the relationship between luminous efficiency and current density of a light emitting surface.

FIG. 8 is a graph illustrating the relationship between luminous efficiency and current density of a light emitting surface. When current density is about 10 A/cm$^2$ or more, if the current density is low, luminous efficiency is high, and if the current density is high, luminous efficiency is low.

The relationship between the current density and the luminous efficiency, and light emitting area are numerically shown in Table 1.

TABLE 1

| Light emitting area (cm$^2$) | Current density (A/cm$^2$) | Luminous efficiency (lm/W) | Improvement (%) |
|---|---|---|---|
| 0.0056 | 62.5 | 46.9 | 100 |
| 0.0070 | 50.0 | 51.5 | 110 |
| 0.0075 | 46.7 | 52.9 | 113 |
| 0.0080 | 43.8 | 54.1 | 115 |

Referring to FIG. 8 and Table 1, as the light emitting area increases, luminous efficiency increases. However, in order to ensure the light emitting area, the area of the distributed electrodes needs to be reduced, which reduces current density of the light emitting surface. The reduction in current density of the light emitting surface may deteriorate electrical characteristics of the semiconductor light emitting device.

However, this problem can be solved by ensuring current spreading by using contact holes according to the embodiments of the invention. Therefore, the deterioration in electrical characteristics that may be caused by the reduction in current density can be prevented by using a method of forming contact holes in the semiconductor light emitting device that do not extend to the light emitting surface for current spreading but are formed therein. Therefore, the semiconductor light emitting device according to the embodiments of the invention performs desired current spreading and ensures a maximum light emitting area to obtain desirable luminous efficiency.

As set forth above, according to exemplary embodiments of the invention, the semiconductor light emitting device can prevent emitted light from being reflected or absorbed by electrodes and ensure the maximum light emitting area by forming the electrodes of semiconductor layers, located in a light emitting direction, below an active layer except for part of the electrodes, thereby maximizing luminous efficiency.

Further, at least one contact hole is formed in the electrode to smoothly perform current spreading, such that uniform current spreading can be performed with the electrode having a small area.

Further, since the via hole is formed at the upper surface of the semiconductor light emitting device, alignment is not required during die bonding, and wire bonding can be easily performed. In addition, since the semiconductor light emitting device has a vertical structure, wire bonding and die bonding that can be easily performed at low cost can be used together when manufacturing a package. Therefore, mass production can be achieved at low cost.

Therefore, according to the embodiments of the invention, mass production of light emitting devices at low cost with high reliability and high quality can be realized.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device comprising:
    a first conductivity type semiconductor layer;
    an active layer on the first conductivity type semiconductor layer;
    a second conductivity type semiconductor layer on the active layer;
    a second electrode layer on the second conductivity type semiconductor layer;
    an insulating layer on the second electrode layer;
    a first electrode layer on the insulting layer; and
    a conductive substrate on the first electrode layer,
        wherein the second electrode layer has an exposed area at an interface between the second electrode layer and the second conductivity type semiconductor layer, and
        the first electrode layer comprises at least one contact hole electrically connected to the first conductivity type semiconductor layer, electrically insulated from the second conductivity type semiconductor layer and the active layer, and extending from one surface of the first electrode layer to at least a part of the first conductivity type semiconductor layer.

2. The semiconductor light emitting device of claim 1, further comprising an electrode pad unit formed at the exposed area of the second electrode layer.

3. The semiconductor light emitting device of claim 1, wherein the exposed area of the second electrode layer is a region exposed by a via hole formed through the first conductivity type semiconductor layer, the active layer, and the second conductivity type semiconductor layer.

4. The semiconductor light emitting device of claim 3, wherein the diameter of the via hole increases in a direction from the second electrode layer toward the first conductivity type semiconductor layer.

5. The semiconductor light emitting device of claim 3, wherein an insulating layer is formed on an inner surface of the via hole.

6. The semiconductor light emitting device of claim 1, wherein the exposed area of the second electrode layer is formed at the edge of the semiconductor light emitting device.

7. The semiconductor light emitting device of claim 1, wherein the second electrode layer reflects light generated from the active layer.

8. The semiconductor light emitting device of claim 7, wherein the second electrode layer comprises one metal selected from a group consisting of Ag, Al, and Pt.

9. The semiconductor light emitting device of claim 1, wherein an irregular pattern is formed on a surface opposite to another surface of the first conductivity type semiconductor layer forming the interface with the active layer.

10. The semiconductor light emitting device of claim 9, wherein the irregular pattern has a photonic crystal structure.

11. The semiconductor light emitting device of claim 1, wherein the conductive substrate comprises one metal selected from a group consisting of Au, Ni, Cu, and W.

12. The semiconductor light emitting device of claim 1, wherein the conductive substrate comprises one selected from a group consisting of Si, Ge, and GaAs.

* * * * *